(12) United States Patent
Mößnang et al.

(10) Patent No.: US 8,542,013 B2
(45) Date of Patent: Sep. 24, 2013

(54) METHOD AND DEVICE FOR A MAGNETIC RESONANCE SYSTEM CONTROL SEQUENCE

(75) Inventors: Georg Mößnang, München (DE); Dieter Ritter, Fürth (DE)

(73) Assignee: Siemens Aktiengesellschaft, München (DE)

(*) Notice: Subject to any disclaimer, the term of this patent is extended or adjusted under 35 U.S.C. 154(b) by 260 days.

(21) Appl. No.: 13/077,716

(22) Filed: Mar. 31, 2011

(65) Prior Publication Data

US 2011/0241680 A1 Oct. 6, 2011

(30) Foreign Application Priority Data

Apr. 1, 2010 (DE) .................. 10 2010 013 672

(51) Int. Cl.
G01V 3/00 (2006.01)

(52) U.S. Cl.
USPC .......................................... 324/309; 324/307

(58) Field of Classification Search
USPC .................. 324/300–322; 600/407–445
See application file for complete search history.

(56) References Cited

U.S. PATENT DOCUMENTS

| | | | |
|---|---|---|---|
| 6,522,139 B1* | 2/2003 | Thompson et al. | 324/307 |
| 7,480,527 B2* | 1/2009 | Deshpande et al. | 600/413 |
| 8,120,359 B2* | 2/2012 | Diehl et al. | 324/309 |
| 8,148,981 B2* | 4/2012 | Yui | 324/309 |
| 2011/0254546 A1* | 10/2011 | Ritter | 324/307 |
| 2012/0161764 A1* | 6/2012 | Ritter et al. | 324/309 |
| 2012/0194185 A1* | 8/2012 | Ritter | 324/309 |
| 2012/0268130 A1* | 10/2012 | Fautz et al. | 324/318 |

FOREIGN PATENT DOCUMENTS

DE 10 2009 024 077 A1 12/2010

OTHER PUBLICATIONS

German Office Action dated Jun. 14, 2011 for corresponding German Patent Application No. DE 10 2010 013 672.7 with English translation.
W. Grissom et al., "Spatial Domain Method for the Design of RF Pulses in Multicoil Parallel Excitation," Magnetic Resonance in Medicine, 56: (2006), pp. 620-629.
K. Setsompop, "Design Algorithms for Parallel Transmission in Magnetic Resonance Imaging," PhD Thesis, MIT (Harvard University) USA, Jun. 2008.
I. Graesslin et al., "SAR Reduction for Parallel Transmission using VERSE and k-space Filtering," Proceedings of the International Society of Magnetic Resonance in Medicine, 15: (2007).
C. Yip et al., "Iterative RF Pulse Design for Multidimensional, Small-Tip-Angle Selective Excitation," Magnetic Resonance in Medicine 54: (2005), pp. 908-917.
D. Lee et al., "Time-Optimal Design for Multidimensional and Parallel Transmit Variable-Rate Selective Excitation," Magnetic Resonance in Medicine 61: (2009), pp. 1471-1479.

* cited by examiner

*Primary Examiner* — Brij Shrivastav
(74) *Attorney, Agent, or Firm* — Lempia Summerfield Katz LLC

(57) ABSTRACT

A method and a control sequence determination device for determining a magnetic resonance system control sequence is provided. A multichannel pulse train with a plurality of individual RF pulse trains is sent out by a magnetic resonance system over different independent radio-frequency channels in parallel. Based on a prespecified k-space gradient trajectory and a prespecified target magnetization, a multichannel pulse train is calculated in an RF pulse optimization method, where in an RF exposure optimization method, the k-space gradient trajectory is optimized using a function parameterizable at least with respect to an RF exposure value of an object under examination.

18 Claims, 4 Drawing Sheets

METHOD AND DEVICE FOR A MAGNETIC RESONANCE SYSTEM CONTROL SEQUENCE

This application claims the benefit of DE 10 2010 013 672.7, filed Apr. 1, 2010.

BACKGROUND

The present embodiments relate to a method and a control sequence device for determining and using a magnetic resonance system control sequence.

In a magnetic resonance system, a body to be examined may be subjected with the aid of a basic field magnet system to a relatively high basic magnetic field of 3 or 7 Tesla, respectively, for example. A magnetic field gradient is applied with the aid of a gradient system. Radio-frequency excitation signals (RF signals) are sent out by suitable antenna devices over a high-frequency transmission system that is designed to lead to the nuclear magnetic resonance of specific atoms excited by the radio-frequency field being flipped by a defined flip angle in relation to magnetic field lines of the basic magnetic field. This radio-frequency excitation or the resulting flip angle distribution is also referred to below as core magnetization or magnetization. In the relaxation of the nuclear spin radio-frequency signals, magnetic resonance signals are emitted. The magnetic resonance signals are received by suitable receive antennas and further processed. Desired image data may be reconstructed from raw data acquired in this way. The radio-frequency signals for nuclear spin magnetization may be sent out by a bodycoil.

The bodycoil may include a birdcage antenna that includes a plurality of transmit rods arranged in parallel to the longitudinal axis around a patient space of a tomograph, in which a patient is located during examination. On an end-face side, the antenna rods are connected capacitively to each other in a ring shape.

Previously, bodycoils may have been operated in a homogeneous mode (e.g., a CP mode). A single temporal RF signal is issued to all components of the transmit antenna (e.g., all transmit rods of a birdcage antenna). The pulses may be transferred offset in phase to the individual components with a displacement adapted to the geometry of the transmit coil. For a birdcage antenna with 16 rods, for example, the rods may be activated with the same RF signal offset with a phase displacement of 22.5°. Such a homogeneous excitation results in a global radio-frequency exposure of the patient, which in accordance with the regulations, must be restricted, since too great a radio-frequency exposure may lead to damage to the patient. The radio-frequency exposure of the patient may be calculated in advance during the planning of the radio-frequency pulses to be output, and the radio-frequency pulses are selected so that a specific threshold is not reached. A measure of radio-frequency exposure may be the specific absorption rate (SAR) value, which specifies in Watts/kg the biological stress, to which the patient is exposed by a specific radio-frequency pulse output. For a global SAR of a patient, a standardized limit of 4 Watts/kg at the First Level applies in accordance with the IEC standard. As well as the advance planning, the SAR exposure of the patient is monitored continuously during the examination by suitable safety devices on the magnetic resonance system, and a measurement is changed or aborted if the SAR value lies above intended standard levels. Accurate planning is sensible in order to avoid such an interruption of a measurement, since the interruption may make a new measurement necessary.

With more recent magnetic resonance systems, the individual transmit channels (e.g., the individual rods of the birdcage antenna) may be provided with RF signals adapted individually to the imaging. A multichannel pulse train that includes a plurality of individual radio-frequency pulse trains may be sent out in parallel over the various independent radio-frequency transmit channels. The multichannel pulse train, because of the parallel transmission of the individual pulses, may be referred to as a pTX pulse and may be used as an excitation, refocusing and/or inversion pulse.

Such multichannel pulse trains may be generated in advance for a specific planned measurement. The individual pulse trains (e.g., the RF trajectories) are determined in an optimization method for the individual transmit channels over time as a function of a fixed k-space gradient trajectory that may be predetermined by a measurement protocol. The transmit k-space gradient trajectory (abbreviated below simply to k-space gradient trajectory or gradient trajectory) includes the locations in the k-space that are reached at specific times by setting the individual gradients. The k-space is the local frequency space, and the gradient trajectory in the k-space describes the path on which the k-space is traveled during the transmission of an RF pulse or the parallel pulse through corresponding switching of the gradient pulses over time. By setting the gradient trajectory in the k-space (e.g., by setting the suitable gradient trajectory applied in parallel to the multichannel pulse train), the local frequencies and which specific RF energy amounts will be deposited may be defined.

During the construction of the gradient trajectory, relevant areas in the k-space are also traversed. For example, if a sharply defined region (e.g., a rectangle or oval) is to be excited in the local space, the k-space may also be well covered in an outer boundary area. However, for an unsharp delimitation, coverage in the central k-space area is sufficient.

The user also prespecifies a target magnetization of the RF pulse train for the planning (e.g., a desired flip angle distribution).

With a suitable optimization program, the appropriate RF pulse train is calculated for the individual channels so that the target magnetization is achieved. The protocol developer may also already have a certain level of experience in selecting the k-space trajectory, so that the target magnetization may be achieved thereby. A method for developing such multichannel pulse trains in parallel excitation methods is described, for example, in W. Grishom et al.: "Spatial Domain Method for the Design of RF Pulses in Multicoil Parallel Excitation," Mag. Res. Med. 56, 620-629, 2006.

For a specific measurement, the various multichannel pulse trains, the gradient pulse train to be transmitted coordinated with the various multichannel pulse trains (with suitable x, y and z gradient pulses) and further control requirements are defined in a measurement protocol. The measurement protocol is created in advance and may be retrieved for a specific measurement from a memory and may be modified by the operator locally. During the measurement, the magnetic resonance system is controlled fully automatically on the basis of the measurement protocol, with the control device of the magnetic resonance system reading out the commands from the measurement protocol and processing the commands in turn.

During the transmission of multichannel pulse trains, in the measurement space and thus in the patient, the previously homogenous excitation may be replaced by an excitation formed in any given way. To estimate the maximum radio-frequency exposure, each possible radio-frequency overlay is investigated. Each possible radio-frequency overlay may, for example, be investigated using a patient model including properties typical of tissues (e.g., conductivity, dielectricity, and density) in a simulation. It may be known from previous simulations that hotspots may form in the radio-frequency field in the patient. The radio-frequency exposure may amount to a multiple of the values previously known from the homogenous excitation at the hotspots. The resulting radio-frequency limitations are otherwise unacceptable for the performance of clinical imaging, since the overall transmit power would be too low to create acceptable images if account were taken of the hotspots. The radio-frequency exposure may be reduced during transmission of the multichannel pulse trains.

SUMMARY AND DESCRIPTION

The present embodiments may obviate one or more of the drawbacks or limitations in the related art. For example, a method and a device for determining or using magnetic resonance system control sequences may reduce the radio-frequency exposure of the patient.

In one embodiment of the method, a multichannel pulse train is computed on the basis of a k-space gradient trajectory predetermined by the measurement protocol developer and a predetermined target magnetization in an RF pulse optimization method. In an RF exposure optimization method, the k-space gradient trajectory is optimized using a function parameterizable at least with respect to an RF exposure value of an object under examination.

In the method, the measurement protocol developer may continue to prespecify a k-space gradient trajectory, but the prespecified k-space gradient trajectory may be an initial basic form. In other words, the gradient trajectory may be selected within the framework of the prespecified basic form in the optimization method so that the RF energy is distributed as far as possible within the k-space in order to avoid high RF peaks. It is the RF peaks that increase the effective overall radio-frequency output significantly, which dominates the SAR exposure of the patient. With the method of the present embodiments, the radio-frequency exposure for the patient may be reduced in a simple manner for the same image quantity by a factor of almost three.

One embodiment of a control sequence determination device is configured such that, in an RF exposure optimization method, the control sequence determination device optimizes the k-space gradient trajectory using a function that is parameterizable at least with respect to an RF exposure value of an object under examination.

In one embodiment of a method for operating a magnetic resonance system, in accordance with the previously described method, a control sequence is determined, and the magnetic resonance system is operated using the control sequence. One embodiment of a magnetic resonance system has a control sequence determination device.

The control sequence determination device may be in the form of software components. For example, the RF pulse optimization unit and an RF exposure optimization unit may be in the form of software components. An input interface may include an operator interface (e.g., a graphical user interface) for manual input of the k-space gradient trajectory and a target magnetization. The input interface may also include an interface for selecting and transferring data from a data memory arranged within the control sequence determination device or connected to the control sequence determination device over a network (e.g., if necessary, also using the operator interface). The control sequence output interface may include an interface that transmits the control sequence to a magnetic resonance controller in order to control the measurement directly therewith, and also to an interface that sends the control sequence over a network and/or stores the control sequence in a memory for subsequent use. The interfaces may be configured at least partly in the form of software and may access hardware interfaces of an existing computer.

The present embodiments include a computer program that is operable to be loaded directly into a non-transitory memory of a control sequence determination device, with program code sections to execute all acts of the method of the present embodiments when the program is executed in the control sequence determination device. Such a software implementation has the advantage that previous devices used for determining the control sequences (e.g., suitable computers in computer centers of the magnetic resonance system manufacturer) may be modified in a suitable manner by implementing the program to determine, with the present embodiments, control sequences that are connected with a lower radio-frequency exposure.

The detailed disclosure contains advantageous developments and embodiments, with embodiments of one category able to be developed in a similar way to another category. Various combinations of embodiments are possible.

Geometry parameters of the k-space gradient trajectory are minimized within the RF exposure optimization method. The geometry parameters may be parameters for determining the geometry design of Echo Planar Imaging (EPI_trajectories and/or spoke positions and/or spiral geometries and/or radial geometries and/or free-form geometries).

For example, the gradient trajectory may be predetermined as a spiral with two variable parameters, with an original linear extension of the radius for an Archimedes spiral being adjustable variably by a function (e.g., a 2-point spline). Through the variable geometry parameters, the propagation of the spirals in the x direction and y direction and the space between two adjacent tracks within the spirals may be influenced.

With a spoke geometry in the k-space, individual points in the k-space are accessed by setting x and y gradients (e.g., ten points that lie on a spiral). To keep an accessed x/y position in the k-space, the x gradient and the y gradient are each stopped. (e.g., no more pulses are applied in the x-gradient and y-gradient direction). Instead, a z-gradient is switched during the transmission of the radio frequency pulses in order to measure the relevant location in the k-space on a slice-selective basis. With such a measurement method, the x and y positions of the spokes may be defined in the k-space by suitable selection of the geometry parameters.

Radial geometries may be, for example, rosette geometries, and freeform geometries involve freely-selectable geometries.

The RF exposure optimization method is linked to the RF pulse optimization method. In other words, the methods are integrated into each other in some way (e.g., by the RF exposure optimization method including the RF pulse optimization method or vice versa).

In one embodiment of the method, an iterative method is executed by a multichannel pulse train being determined for a given k-space gradient trajectory using the RF pulse optimization method. This may be done with a normal RF pulse optimization method (e.g., by using a least-mean-square method to match the actual magnetization to a target or required magnetization while varying the RF pulse train to be transmitted). In an act of the iterative method, a predicted RF exposure of the object under examination is determined on the basis of the determined multichannel pulse train. The prespecified RF pulses within the multichannel pulse train and the predetermined gradient trajectory (or the respective gradient pulses defined thereby) are used in a simulation, and the RF exposure is computed in this way. Based thereon, the geometry parameters of the k-space gradient trajectory are varied in accordance with a predetermined optimization strategy of the RF exposure optimization method to reduce the RF exposure. The aforementioned acts are repeated with the new k-space gradient trajectory in further iterations. The iterations are done until an abort criterion is reached (e.g., until a maximum number of iterations have been executed or the target function to be minimized has reached the desired minimum or has fallen below a predetermined $\in$ value).

The multichannel pulse train is initially calculated within the framework of the RF pulse optimization method linked to the RF exposure optimization method for a lower target magnetization. The multichannel pulse train determined during this process is scaled up to a final target magnetization and corrected once again. This procedure exploits the fact that for small magnetizations (e.g., for small flip angles (in the so-called low-flip range) between 0 and 5°), the magnetization behavior is still linear. Therefore, a calculation with one optimization method is significantly simpler in this range. If the optimum multichannel pulse train is found for this range, an upscaling is possible without any difficulty in a subsequent act. If, for example, a calculation is to be made in the low-flip area for a flip angle of maximum $\alpha=5°$, and the actual magnetization is to be undertaken with a flip angle $\alpha$ of maximum 90°, in accordance with the ratio of the flip angle, the amplitude values of the RF pulse are multiplied by a factor of 18. Any errors that may arise in such cases may be determined and corrected within the framework of a simulation.

Within the framework of the RF exposure optimization method, as well as the parameters to optimize the k-space gradient trajectory, further parameters may be optimized with respect to an RF exposure value of the object under examination. For example, the parameters used for RF pulse optimization may be varied within the Tikhonov regularization, or other system parameters such as the maximum gradient strength or the slew rate (e.g., the rate of rise of the gradient pulse) may be optimized within the framework of the optimization in order to achieve even better results.

DETAILED DESCRIPTION OF THE DRAWINGS

Figure 1:
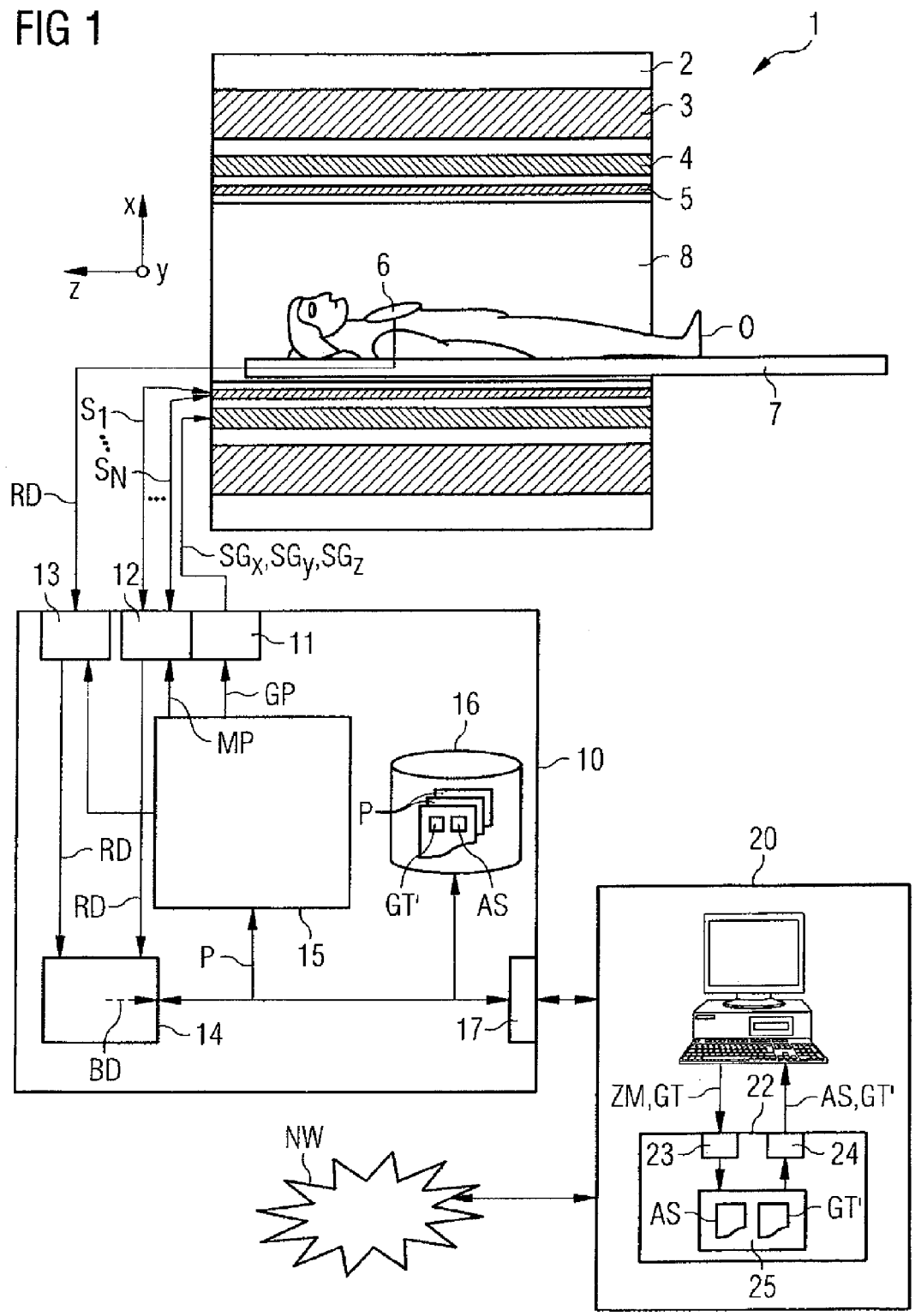
FIG. 1 shows one embodiment of a magnetic resonance system.

FIG. 1 shows a diagram of one embodiment of a magnetic resonance system 1. The magnetic resonance system 1 includes a magnetic resonance scanner 2 with an examination area 8 or patient tunnel located in the magnetic resonance scanner. A bed 7 may be moved into the patient tunnel 8, so that a patient O or sample lying on the bed 7 may be supported during an examination at a specific position within the magnetic resonance scanner 2 relative to the magnetic resonance system 1 and a radio frequency system arranged in the magnetic resonance system 1. The bed 7 may be moved between different positions during a measurement.

The magnetic resonance scanner 2 includes a basic field magnet 3, a gradient system 4 with magnetic field gradient coils to apply any given magnet field gradients in x, y and z directions, and a radio-frequency bodycoil 5 (e.g., a bodycoil). Magnetic resonance signals induced by the object O under examination may be received via the bodycoil 5. Radio-frequency signals for inducing the magnetic resonance signals may also be transmitted with the bodycoil 5. In one embodiment, the magnetic resonance signals induced by the object under examination are received with local coils 6 that may be placed on or below the object O under examination. The components discussed above may be known to the person skilled in the art and are therefore only depicted roughly schematically in FIG. 1.

In the embodiment shown in FIG. 1, the radio-frequency bodycoil 5 is constructed in the form of a birdcage antenna and has a number N of individual antenna rods that run in parallel to the patient tunnel 8 and are arranged evenly distributed on a circumference around the patient tunnel 8. On an end side, the individual antenna rods are each connected capacitively in the form of a ring.

The individual antenna rods may be controlled separately as individual transmit channels $S_1$-$S_N$ by a control device 10. The control device 10 may be a control computer. The control computer may include of a plurality of individual processors. In one embodiment, the plurality of individual processors may be separated spatially and may be connected to each other via suitable cables of the like. The control device 10 is connected via a terminal interface 17 to a terminal 20, via which an operator may control the magnetic resonance system 1. In one embodiment, the terminal 20 is equipped as a computer with a keyboard, one or more screens and other input devices such as a mouse, for example, so that a graphical user interface is available to the operator.

The control device 10 includes units such as a gradient control unit 11. The gradient control unit 11 may include a plurality of subcomponents. Individual gradient coils are switched via this gradient control unit 11 with control signals $SG_x$, $SG_y$, $SG_z$. The control signals involve gradient pulses that are set during a measurement at provided temporal positions and with a determined time sequence.

The control device 10 also features a radio-frequency (RF) transceiver unit 12. The RF transceiver unit 12 includes a plurality of subcomponents, in order to emit radio-frequency pulses separately and in parallel to the individual transmit channels $S_1$-$S_N$, (e.g., to the individually controllable antenna rods). Magnetic resonance signals may also be received via the RF transceiver unit 12. In one embodiment, the magnetic resonance signals may be received with the aid of the local coils 6. The raw data RD received with the local coils 6 is read out and processed by an RF receive unit 13. The magnetic resonance signals received by the RF receive unit 13 or by the bodycoils using the RF transceiver unit 12 are transferred as raw data RD to a reconstruction unit 14. The reconstruction unit 14 reconstructs image data BD from the raw data RD and stores the image data BD in a memory 16 and/or transfers the image data BD via the interface 17 to the terminal 20 so that the operator may view the reconstructed image. The image data BD may also be stored and/or displayed and evaluated via a network NW at other locations.

The gradient controller 11, the RF control unit 12 and the receive unit 13 for the local coils 6 are each controlled in a coordinated manner by a measurement control unit 15. The measurement control unit 15 uses appropriate commands to verify that a desired gradient pulse train GP is transmitted by suitable gradient control signals $SG_x$, $SG_y$, $SG_z$, and controls the RF control unit 12 in parallel so that a multichannel pulse train MP is sent out (e.g., that appropriate radio-frequency pulses are issued on the individual transmit channels $S_1$-$S_N$ in parallel to individual transmit rods of the bodycoil 5). At the appropriate time, the magnetic resonance signals are read out and processed at the local coils 6 by the RF receive unit 13, or possible signals at the bodycoil 5 are read out and processed by the RF transceiver unit 12. The measurement control unit 15 specifies the corresponding signals (e.g., the multichannel pulse train MP) to the radio-frequency transceiver unit 12 and the gradient pulse train GP to the gradient control unit 11 in accordance with a prespecified control protocol P. Stored in this control protocol P is control data that is to be set during a measurement.

In one embodiment, a plurality of control protocols P for different measurements is stored in a memory 16. The plurality of control protocols P may be selected by the operator via the terminal 20 and varied in order to then have a suitable control protocol P available for the measurement currently selected with the measurement control unit 15. The operator may also retrieve control protocols from a manufacturer of the magnetic resonance system, for example, over a network NW and modify and use the retrieved control protocols.

The basic sequence of such a magnetic resonance measurement and the components for control are however known to the person skilled in the art, so the basic sequence and the components for control will not be discussed in any greater detail here. The magnetic resonance scanner 2 and the associated control device may have a plurality of further components, which are likewise not explained here in detail.

The magnetic resonance scanner 2 may be designed in a different manner, for example, with a patient area open at a side. In one embodiment, the radio-frequency bodycoil is not designed as a birdcage antenna. The radio-frequency bodycoil has a plurality of separately controllable transmit channels $S_1$-$S_N$, and a corresponding plurality of channel controllers are also available in the control device 10 through the radio-frequency transceiver device, such that the individual transmit channels $S_1$-$S_N$ may be controlled separately.

FIG. 1 also shows one embodiment of a control sequence determination device 22 schematically. The control sequence determination device 22 is used for determining a magnetic resonance system control sequence AS. The magnetic resonance system control sequence AS includes elements for a specific measurement such as a predefined multichannel pulse train MP for controlling the individual transmit channels $S_1$-$S_N$. The magnetic resonance system control sequence AS is created as a part of the measurement protocol P.

The embodiment of the control sequence determination device 22 shown in FIG. 1 is a part of the terminal 20 and may be implemented in the form of a software component on the processor of the terminal 20. In another embodiment, the control sequence determination device 22 may be part of the control device 10 and may be implemented on a separate processor system. The completed control sequences AS are transferred within the framework of a complete control protocol P over a network NW to the magnetic resonance system 1.

The control sequence determination device 22 includes an input interface 23. The control sequence determination device 22 receives a target magnetization ZM via this input interface 23. The target magnetization specifies how a flip angle distribution should be for the desired measurement. In addition, a k-space gradient trajectory GT is prespecified.

Figure 2:
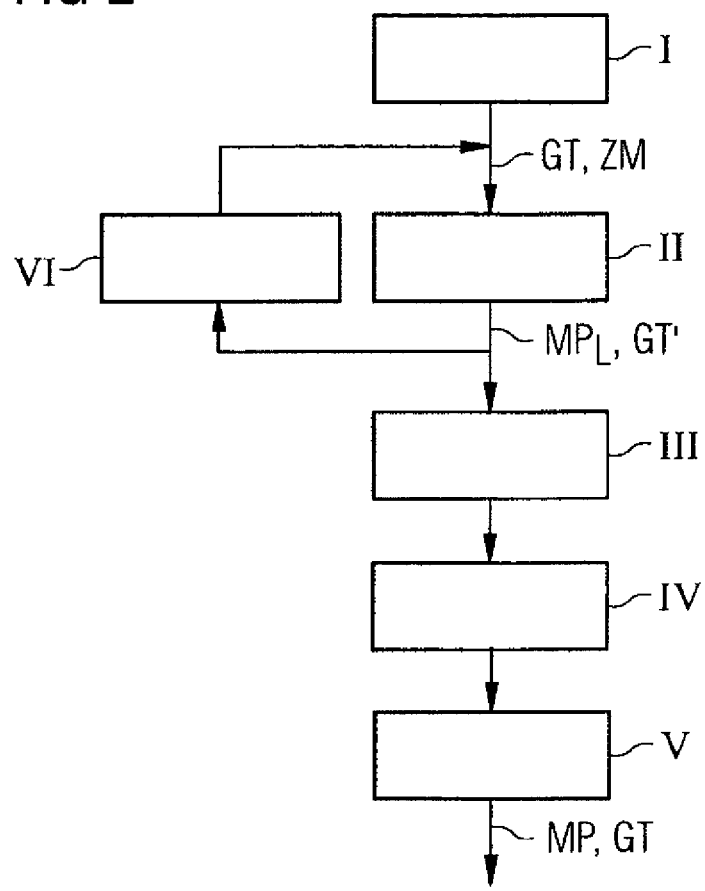
FIG. 2 shows a flow diagram for one embodiment of a method for determining a magnetic resonance system control sequence.

The target magnetization and the k-space gradient trajectory GT (e.g., two specifications) may be provided by an expert who is appropriately qualified to develop control protocols for specific measurements. The two obtained specifications are transferred to an RF pulse optimization unit 25, which automatically generates a specific control sequence AS with an optimum multichannel pulse train MP for achieving the desired target magnetization ZM. In accordance with the present embodiments, this process also includes the modification of the k-space gradient trajectory GT (abbreviated below to gradient trajectory) (e.g., a modified gradient trajectory GT' is created). This data is then output again over a control sequence output interface and may, for example, be transferred within the framework of a control protocol P, in which additional specifications for controlling the magnetic resonance system 1 are provided (e.g., parameters for reconstruction of the images from the raw data) to the control device 10. The execution sequence of such a method for determining a magnetic resonance system control sequence AS is explained below on the basis of the flow diagram shown in FIG. 2, which refers to a simple example.

In act I, the target magnetization ZM and a gradient trajectory GT are specified. The gradient pulse sequence for traversing the gradient trajectory GT is defined. The gradient trajectory GT is prespecified in a form so that a geometry of the gradient trajectory GT may be modified (e.g., an initial basic geometry is prespecified).

Figure 3:
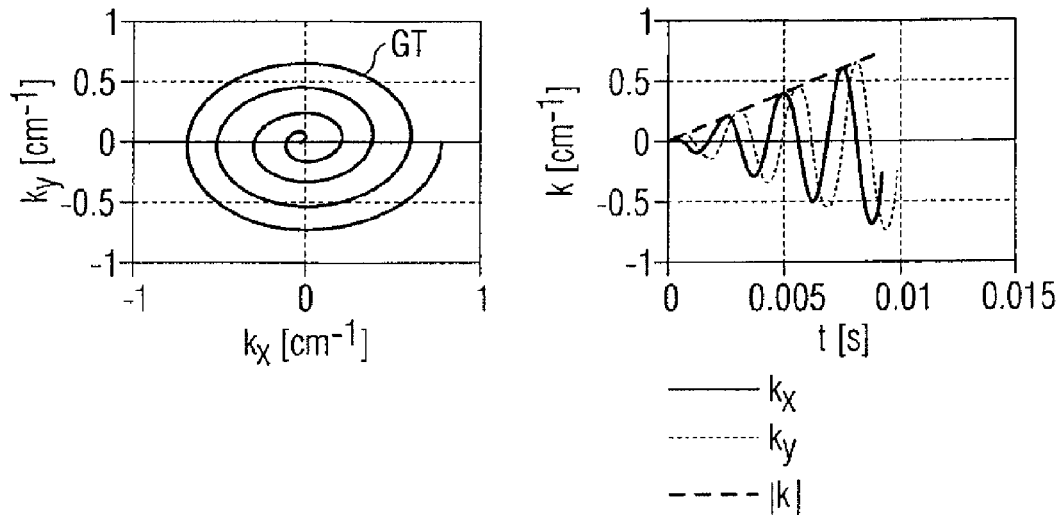
FIG. 3 shows a diagram of an initial geometry of a spiral-shaped gradient trajectory before an optimization.

It is assumed below that the initial prespecified gradient trajectory GT is a spiral in the k-space in an x/y plane. This is shown on the left-hand side in FIG. 3. FIG. 3 shows the initial geometry of the gradient trajectory before the optimization. The coordinates in the k-space in the x and y direction are each specified in units of $cm^{-1}$. The diagram, on the right-hand side, shows the curve of the x gradient in the k-space $k_x$ and shows the y gradient in the k-space $k_y$ over time t (in s). The solid-line curve is the x-gradient vector $k_x$, the dotted curve is the y-gradient vector $k_y$ and the dashed straight line corresponds to an amount of the gradient vector composed of the x and y direction in the k-space. The dashed straight line reflects an expanding with each rotation of the spiral.

The expanded spiral is defined by the following function:

$$k = r(t, n_1, n_2) \cdot e^{(-2\pi i t n_0)} \quad (1)$$

with $r(t, n_1, n_2)$ being the radius of the spiral at time t, and $n_0$ being that the number of points on the spiral. $k_x$ is the real part and $k_y$ the imaginary part of k. The two variables $n_1$ and $n_2$ of the parameters may be varied within the framework of the optimization method in order to be able to optimize the gradient trajectory with respect to a minimization of the RF exposure for the patient. For the initial geometry according to FIG. 3, the variable $n_1=0.33$ and $n_2=0.33$ (e.g., the radius r increases in a linear manner so that the spiral is an Archimedes spiral).

The multichannel pulse train is designed automatically in act II. The individual RF pulse sequences that the different transmit channels transmit are developed (e.g., a precise calculation is made as to which RF pulse shape are sent on which channel). This is first done through a low-flip area with flip angles below 5°, since in the low-flip area, the magnetization still behaves in a linear manner. An iterative optimization method is applied, since this has been shown to be suitable. The finite difference method is used here. Other optimization methods, including non-iterative methods, may be used.

The optimization method occurs such that the least-mean-square between the target magnetization and the actual magnetization is minimized. The following solution is sought:

$$\min(\|m_{act}-m_{tgt}\|^2+R(b)) \quad (2)$$

In equation (2), $m_{act}$ is the actual magnetization, $m_{tgt}$ is the target magnetization and R(b) is the Tikhonov regularization term that is used for weighting the radio frequency function (e.g., amplitude and/or phase). If the solution of equation (2) is found, the result available is a function of the amplitude depending on the time for all available transmit channels (e.g., N functions $b_c(t)$ (one function for each channel c=1 to N) are obtained). For each iteration loop, the RF pulse train $b_c(t)$ is recalculated by a least-square optimization.

According to the prior art, the radio-frequency exposure for the patient is not taken into account. In the present embodiments, the optimization takes place by finding the solution to the following equation:

$$\min(\|m_{act}-m_{tgt}\|^2+R(b)+yP_{eff}) \quad (2a)$$

In equation (2a), y is a constant parameter that is to be selected so that the order of magnitude fits within equation (2a), and $P_{eff}$ is the effective power according to equation $$P_{eff} = \frac{1}{R_a}\sqrt{\frac{1}{T}\int_0^T |b_c(t)|^2 dt} \quad (3)$$

$$= \frac{1}{R_a}\sqrt{\frac{1}{n}\sum_i^n |b_c(t)|^2}$$

$$= \frac{\|b_c(t)\|}{R_a\sqrt{n}}$$

In equation (3), $P_{eff}$ is the effective radio-frequency power in Watts, $b_c(t)$ is the radio-frequency voltage for each individual channel (measured in volts) over the time t (in s), T is the pulse length (in s) and n is the number of checkpoints of the RF function (which are combined in digital form for each pulse), where n is summed over all channels. $R_a$ is a terminating resistance of a radio-frequency power amplifier (generally 50Ω).

Within the iterative method, geometry parameters of the gradient trajectory are also changed in act VI, not only the RF pulses. Both are included in equation (2a) in the actual magnetization $m_{act}$. This additional iterative adaptation of the gradient parameters results in not only the overall function, as specified in equation (2a), being minimized and thus the optimum pulse sequences being found, but also in the effective radio-frequency power being reduced at the same time, as is specified in accordance with equation (3).

Figure 5:
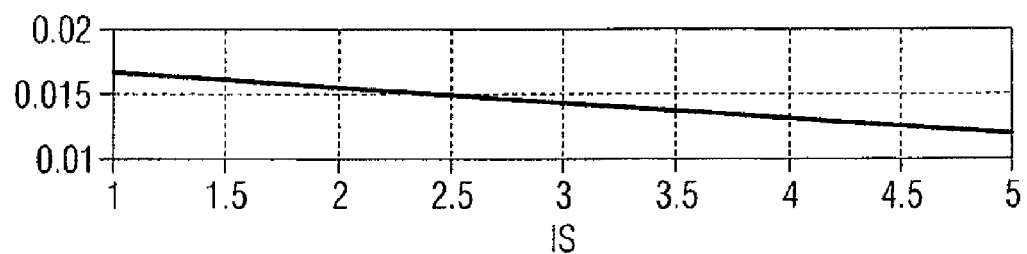
FIG. 5 shows a diagram of an error value between an actual magnetization and a required magnetization as a function of a number of iterations within the optimization method.
Figure 6:
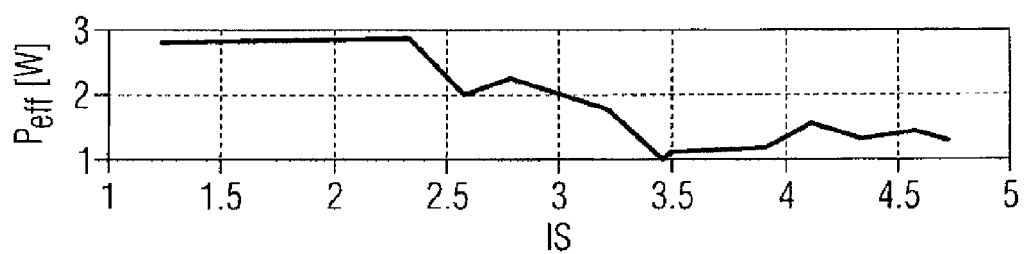
FIG. 6 shows a diagram of an effective radio-frequency output as a function of a number of iterations.

This is shown in FIGS. 5 and 6. FIG. 5 shows the error (e.g., a deviation between $m_{act}$ and $m_{tgt}$) as a function of the iterations IS. An approximation to the actual magnetization is thus achieved in the method. FIG. 6 shows for the same iterations IS, the effective power currently present in accordance with equation 3. The power may be reduced in five iteration steps from a value of 3 W to just over 1 W (e.g., almost a factor of three in power is saved). In FIG. 6, the effective power has been calculated for the low-flip area. With a subsequent upscaling, the saved factor still applies with respect to the RF exposure.

Figure 4:
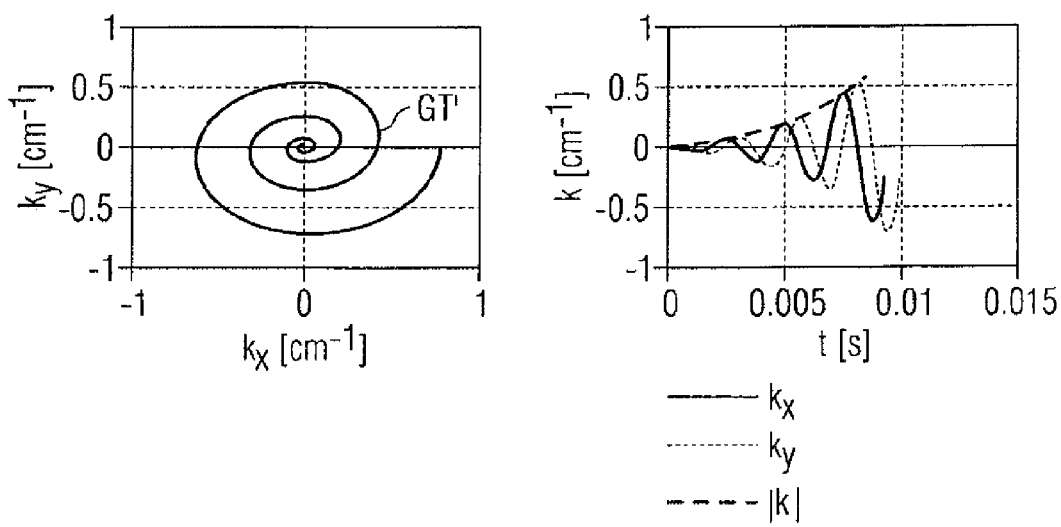
FIG. 4 shows a diagram of an initial geometry of a spiral-shaped gradient trajectory after an optimization.

FIG. 4 shows, by comparison with FIG. 3, how, within the framework of the iteration after five iterations, the geometry of the gradient trajectory has changed in the k-space. This may be seen on the left-hand side within the $k_x$-/$k_y$ plane. The gradient trajectory has the shape of a spiral and covers approximately the same area as the gradient trajectory does before the optimization, so that the image quality does not changed significantly. However, the gradient trajectory contains fewer circuits overall, which shows that less radio-frequency energy has been deposited in the local frequency space. This has the effect of a lower radio-frequency exposure of the patient. The geometry parameters of the spiral may amount to $n_1$=0.097 and $n_2$=0.302. One geometry parameter has been automatically varied in the optimization, while the other geometry parameter has remained almost the same.

At the end of the optimization process, a multichannel pulse sequence $MP_L$ obtained for the low-flip area and a gradient trajectory GT' are present. The multichannel pulse sequence $MP_L$ may be upscaled in act III, in order to obtain the target magnetization, which may not lie in the flip angle area of 5° but goes up to a 90° flip angle. This may be done by multiplication of the amplitudes of the individual pulses by a desired scaling factor.

In act IV, the error that may occur during upscaling is corrected by a partial Bloch simulation. The partial Bloch simulation is undertaken at individual points in time within the pulse sequence. Using the Bloch equations, the data for the respective time, at which the check is to take place, is tested in a simulator using the Bloch equations, and the magnetization achieved is thus calculated. Deviations from the specifications of the target magnetization may be discovered, and corresponding smaller corrections may be undertaken by changing the radio-frequency pulse sequences.

In act V, all parameters found are tested again by a temporally complete Bloch simulation. Within the temporally complete Bloch simulation, a check is made as to whether the magnetization that is achieved with the parameters actually corresponds to the target magnetization.

Figure 7:
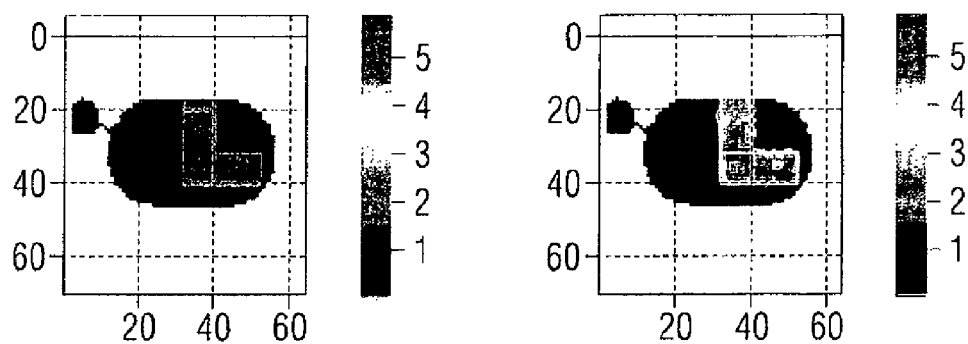
FIG. 7 shows a diagram of the results of a Bloch simulation of an actual magnetization achieved with an optimized gradient compared to a desired magnetization.

FIG. 7 shows the result of a Bloch simulation for transmitting the multichannel pulse train MP and the optimized gradient trajectory GT' for a desired target magnetization in an L form. The target magnetization (left-hand side) is compared to the actual magnetization (right-hand side). A layer through an oval phantom in the patient coordinate system is shown for the target magnetization and the actual magnetization with the lower side of the images corresponding to the rear side of the patient and the rear side of the patient being located on the left-hand side in each case. The scales are the pixel numbers. The images of FIG. 7 show how, with the method of the present embodiments, desired target magnetization may be achieved very well.

The upper example shows, simply, how a reduction of the radio-frequency exposure of the patient by a factor of almost 3 may be achieved through the method of the present embodiments. A greater reduction may be possible by, for example, varying further parameters that may be relevant within the equation (2a) (e.g., regularization function or the factor y).

The more detailed methods and structures described above involve exemplary embodiments, and the basic principle may be varied over wide areas by the person skilled in the art without departing from the area of the invention. The use of the indefinite article "a" does not exclude the features involved from being present a number of times. Also, the term "unit" does not exclude the unit from including a number of components that may be spatially distributed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a magnetic resonance system control sequence, the method comprising:
   calculating, in an RF pulse optimization, a multichannel pulse train based on a prespecified k-space gradient trajectory and a prespecified target magnetization; and
   storing, by a determination device in a memory, the multichannel pulse train with a plurality of individual RF pulse trains, the plurality of individual RF pulse trains being for transmission in parallel by a magnetic resonance system over different independent radio-frequency transmit channels,
   wherein the k-space gradient trajectory is optimized using a parameterizable function in an RF exposure optimization, the parameterizable function being parameterizable at least with respect to an RF exposure value of an object under examination.

2. The method as claimed in claim 1, wherein geometry parameters of the k-space gradient trajectory are varied in the RF exposure optimization.

3. The method as claimed in claim 2, wherein the geometry parameters include parameters for determining a geometry design of EPI trajectories, spoke positions, spiral geometries, radial geometries, or free-form geometries.

4. The method as claimed in claim 1, wherein the RF exposure optimization is linked to the RF pulse optimization.

5. The method as claimed in claim 4, wherein calculating the multichannel pulse train comprises:
   calculating the multichannel pulse train for a given k-space gradient trajectory using the RF pulse optimization;
   determining a predicted RF exposure of the object under examination using the multichannel pulse train; and
   varying geometry parameters of the given k-space gradient trajectory in accordance with a prespecified optimization strategy of the RF exposure optimization based on the determined predicted RF exposure to reduce the RF exposure value,
   wherein the calculating, the determining and the varying are repeated with a new k-space gradient trajectory in an additional iteration until an abort criterion is reached.

6. The method as claimed in claim 1, wherein parameters with respect to the RF exposure value of the object under examination are optimized within the RF exposure optimization.

7. The method as claimed in claim 4, wherein the calculation of the multichannel pulse train is undertaken within the RF pulse optimization linked to the RF exposure optimization for a lower target magnetization, and
   wherein the calculated multichannel pulse train is subsequently upscaled to a final target magnetization, the final target magnetization being the prespecified target magnetization.

8. A method for operating a magnetic resonance system with a plurality of independent radio-frequency transmit channels, the method comprising:
   calculating, in an RF pulse optimization method, a control sequence comprising a multichannel pulse train based on a prespecified k-space gradient trajectory and a prespecified target magnetization;
   transmitting, by the magnetic resonance system, the multichannel pulse train with a plurality of individual RF pulse trains, the plurality of individual RF pulse trains being transmitted in parallel over the plurality of independent radio-frequency transmit channels; and
   operating the magnetic resonance system using the control sequence,
   wherein the k-space gradient trajectory is optimized using a parameterizable function in an RF exposure optimization method, the parameterizable function being parameterizable at least with respect to an RF exposure value of an object under examination.

9. A control sequence determination device for determining a magnetic resonance system control sequence, the magnetic resonance system control sequence comprising a multichannel pulse train with a plurality of individual RF pulse trains to be sent out by the magnetic resonance system over different independent radio-frequency transmit channels in parallel, the control sequence determination device comprising:
   an input interface for detecting a k-space gradient trajectory and a target magnetization;
   an RF pulse optimization unit configured to calculate the multichannel pulse train in an RF pulse optimization method based on a prespecified k-space gradient trajectory and a prespecified target magnetization; and
   a control sequence output interface,
   wherein the control sequence determination device is configured to optimize the k-space gradient trajectory using a parameterizable function in an RF exposure optimization method, the parameterizable function being parameterizable at least with respect to an RF exposure value of an object under examination.

10. A magnetic resonance system comprising:
    a plurality of independent radio-frequency transmit channels;
    a gradient system;
    a control device that is configured to:
       carry out a desired measurement based on a prespecified control sequence;
    send out a multichannel pulse train comprising a plurality of parallel individual RF pulse trains over the plurality of independent radio-frequency transmit channels; and
       send out a gradient pulse train coordinated to the plurality of parallel individual RF pulse trains over the gradient system; and
    a control sequence determination device comprising:
       an input interface for detecting a k-space gradient trajectory and a target magnetization;
       an RF pulse optimization unit configured to calculate the multichannel pulse train in an RF pulse optimization method based on a prespecified k-space gradient trajectory and a prespecified target magnetization; and
       a control sequence output interface,
    wherein the control sequence determination device is configured to optimize the k-space gradient trajectory using a parameterizable function in an RF exposure optimization method, the parameterizable function being parameterizable at least with respect to an RF exposure value of an object under examination, and
    wherein the control sequence determination device is configured to determine a control sequence and to transfer the control sequence to the control device, the control sequence comprising the multichannel pulse train, the control sequence being the prespecified control sequence.

11. A non-transitory computer readable medium comprising computer executable instructions that, when executed by a control sequence determination device, cause the control sequence determination device to determine a magnetic resonance system control sequence, the instructions comprising:

calculating, in an RF pulse optimization method, a multichannel pulse train based on a prespecified k-space gradient trajectory and a prespecified target magnetization; and transmitting, by the magnetic resonance system, the multichannel pulse train with a plurality of individual RF pulse trains, the plurality of individual RF pulse trains being transmitted in parallel over different independent radio-frequency transmit channels, wherein the k-space gradient trajectory is optimized using a parameterizable function in an RF exposure optimization method, the parameterizable function being parameterizable at least with respect to an RF exposure value of an object under examination.

12. The method as claimed in claim 2, wherein the RF exposure optimization method is linked to the RF pulse optimization method.

13. The method as claimed in claim 3, wherein the RF exposure optimization method is linked to the RF pulse optimization method.

14. The method as claimed in claim 2, wherein parameters with respect to the RF exposure value of the object under examination are optimized within the RF exposure optimization method.

15. The method as claimed in claim 3, wherein parameters with respect to the RF exposure value of the object under examination are optimized within the RF exposure optimization method.

16. The method as claimed in claim 4, wherein parameters with respect to the RF exposure value of the object under examination are optimized within the RF exposure optimization method.

17. The method as claimed in claim 5, wherein parameters with respect to the RF exposure value of the object under examination are optimized within the RF exposure optimization method.

18. The method as claimed in claim 5, wherein the calculation of the multichannel pulse train is undertaken within the RF pulse optimization method linked to the RF exposure optimization method for a lower target magnetization, and wherein the calculated multichannel pulse train is subsequently upscaled to a final target magnetization, the final target magnetization being the prespecified target magnetization.

* * * * *